(12) United States Patent
Takaishi et al.

(10) Patent No.: US 8,779,492 B2
(45) Date of Patent: Jul. 15, 2014

(54) SEMICONDUCTOR DEVICE AND METHOD OF FORMING THE SAME

(75) Inventors: Yoshihiro Takaishi, Tokyo (JP); Kazuhiro Nojima, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 200 days.

(21) Appl. No.: 13/192,487

(22) Filed: Jul. 28, 2011

(65) Prior Publication Data

US 2012/0032256 A1 Feb. 9, 2012

(30) Foreign Application Priority Data

Aug. 9, 2010 (JP) .................................. P2010-178740

(51) Int. Cl.
*H01L 29/94* (2006.01)
*H01L 23/52* (2006.01)

(52) U.S. Cl.
USPC ........... 257/302; 257/530; 257/529; 257/268; 257/E29.183; 257/E29.189

(58) Field of Classification Search
CPC ............ H01L 23/5252; H01L 23/5258; H01L 27/10841; H01L 23/5256
USPC ............... 257/50, 68, 71, 209, 263, 265, 302, 257/331, 334, 328, 499, 501, 506, 528, 529, 257/530, E28.092, E27.084, E21.646
See application file for complete search history.

(56) References Cited

U.S. PATENT DOCUMENTS

| 5,312,767 | A | * | 5/1994 | Shimizu et al. | 438/268 |
| 2007/0170427 | A1 | * | 7/2007 | Saino | 257/50 |
| 2009/0085088 | A1 | * | 4/2009 | Takaishi | 257/314 |
| 2009/0184350 | A1 | * | 7/2009 | Kodama et al. | 257/296 |

FOREIGN PATENT DOCUMENTS

| JP | 2008-300623 | 12/2008 |
| JP | 2009-290189 | 12/2009 |

* cited by examiner

*Primary Examiner* — Cuong Q Nguyen
*Assistant Examiner* — Galina Yushina
(74) *Attorney, Agent, or Firm* — Young & Thompson

(57) ABSTRACT

A semiconductor device includes a first island and a first electrode. The first island includes a first semiconductor region, a first insulation region, and a first insulating film. The first semiconductor region has first and second side surfaces adjacent to the first insulation region and the first insulating film, respectively. The first electrode is adjacent to the first insulation region and the first insulating film. The first insulating film is between the first electrode and the first semiconductor region.

6 Claims, 12 Drawing Sheets

SEMICONDUCTOR DEVICE AND METHOD OF FORMING THE SAME

BACKGROUND OF THE INVENTION

1. Field of the Invention

The present invention generally relates to a semiconductor device and a method of forming the same.

Priority is claimed on Japanese Patent Application No. 2010-178740, filed Aug. 9, 2010, the content of which is incorporated herein by reference.

2. Description of the Related Art

In a semiconductor device, for the purpose of repairing malfunctioning caused by problems in manufacturing, switching of circuit function, or the like, the circuit interconnection information is generally changed in the final manufacturing process, thereby causing the desired operation of the circuit.

For implementing this type of change in the circuit interconnectivity, a fuse is provided in the semiconductor device beforehand and the conductivity condition of the fuse is changed by inputting a particular signal from the outside of the semiconductor device, thereby causing the desired operation of the circuit. The fuse used to do this is known as an antifuse (or electrical fuse), which is non-conducting in its initial state and can be changed to the conducting state by responding to the input of a signal from outside.

Japanese Unexamined Patent Application, First Publication, No. JP-A-2009-290189 discloses that a fuse element having a structure generally the same as a MOS transistor is formed, and the conductivity state thereof is changed by the existence or non-existence of the destruction of an insulating film when forming the antifuse in a semiconductor device having the MOS transistor.

Japanese Unexamined Patent Application, First Publication, No. JP-A-2008-300623 discloses that development is being done with regard to semiconductor devices that use transistors formed as three-dimensional MOS transistor, in place of planar MOS transistors in the related art with advances in microfine transistors in recent years.

SUMMARY

In one embodiment, a semiconductor device may include, but is not limited to, a first island and a first electrode. The first island includes a first semiconductor region, first insulation region, and a first insulating film. The first semiconductor region has first and second side surfaces adjacent to the first insulation region and the first insulating film, respectively. The first electrode is adjacent to the first insulation region and the first insulating film. The first insulating film is between the first electrode and the first semiconductor region.

In another embodiment, a semiconductor device may include, but is not limited to, a semiconductor pillar, an insulation region, a fuse insulating film, and a fuse electrode. The semiconductor pillar has at least first and second side surfaces. The insulation region is in contact with the first side surface of the semiconductor pillar. The fuse insulating film is in contact with the second side surface of the semiconductor pillar. The fuse electrode is on the second side surface of the semiconductor pillar while the fuse insulating film is interposed between the fuse electrode and the second side surface of the semiconductor pillar.

In still another embodiment, a semiconductor device may include, but is not limited to, a first island, a first diffusion region, a first contact plug, a fuse electrode, and a second contact plug. The first island includes a first semiconductor pillar in a first active region, a first insulation region in a first isolation region, and a fuse insulating film. The first semiconductor pillar has first and second side surfaces adjacent to the first insulation region and the fuse insulating film, respectively. The first diffusion region is adjacent to a bottom of the first semiconductor pillar. The first contact plug is coupled to the first diffusion region. The first contact plug is disposed over the first diffusion region. The fuse electrode surrounds the island. The second contact plug is coupled to the fuse electrode. The second contact plug is disposed over a portion of the fuse electrode and a portion of the first insulation region.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in detail with reference to FIGS. 15-17, in order to facilitate the understanding of the present invention.

In the semiconductor device including a vertical MOS transistor, similar to the case of the planar MOS transistors in the related art, the use of an antifuse that is an element having a structure generally the same as that of a vertical MOS transistor has also been envisioned.

The inventors of the present invention investigated the use of an element with the same general configuration as a vertical MOS transistor as an antifuse.

The configuration of an antifuse formed using a vertical MOS transistor will first be described. The vertical MOS transistor can be formed by the method disclosed by, for example, Japanese Unexamined Patent Application, First Publication, No. JP-A-2008-300623.

Figure 15:
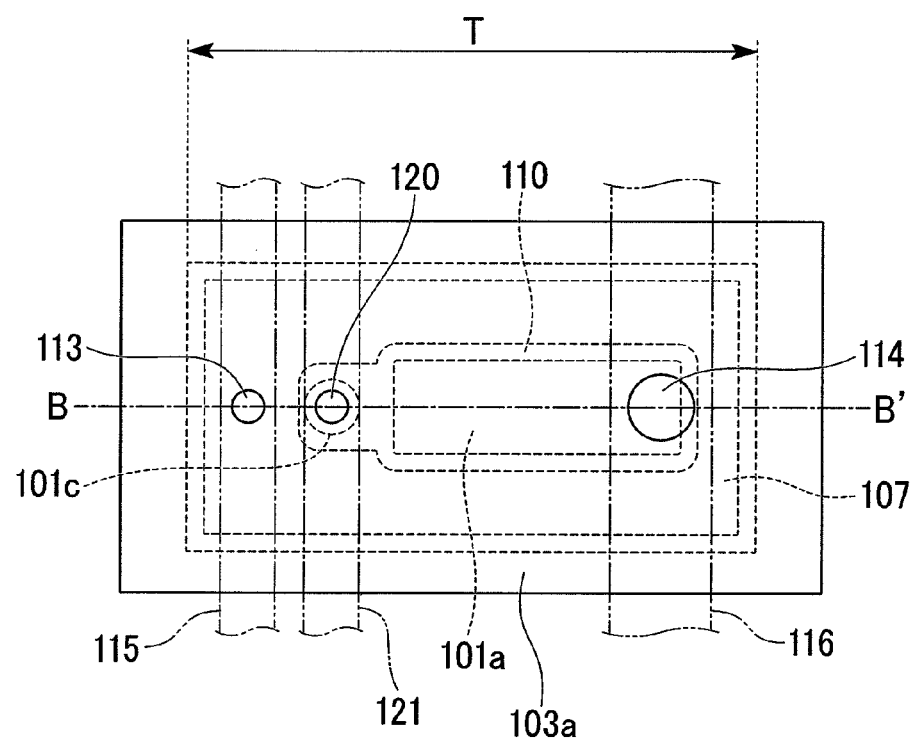
FIG. 15 is a fragmentary plan view illustrating a semiconductor device in accordance with the related art.

FIG. 15 is a fragmentary plan view illustrating the semiconductor device including the antifuse formed using the vertical MOS transistor structure in the related art. FIG. 16 is a fragmentary cross sectional elevation view, taken along B-B' in FIG. 15, illustrating the semiconductor device including the antifuse formed using the vertical MOS transistor structure in the related art.

A transistor is disposed within an active region T.

A buried insulator that serves as an isolation region 102 is provided on a semiconductor substrate 101. The semiconductor substrate is made of p-type silicon. The active region T is isolated by the isolation region 102.

A fuse element F having a structure equivalent to that of the vertical MOS transistor is disposed in the active region T.

In the fuse element F, a second pillar (three-dimensional semiconductor pillar) 101c functions as an electrode of the fuse element F. The second pillar 101c is formed by etching a surface of the semiconductor substrate 101.

A first n-type impurity diffusion region 108a and a second n-type impurity diffusion region 108b are formed adjacent to a bottom part of the second pillar 101c.

An n-type fourth impurity diffusion region 117 is formed over the second pillar 101c.

A fuse electrode 110 that is another electrode of the fuse element F is provided at the side surface of the second pillar 101c, via a fuse insulating film 109, so as to surround the outer periphery of the second pillar 101c.

An insulating film 107 is formed on the surface of the semiconductor substrate 101 in the area surrounding the second pillar 101c. The insulating film 107 electrically insulates the first impurity diffusion region 108a and the second impurity diffusion region 108b from a bottom of the fuse electrode 110.

A first interlayer insulating film 111 and a second interlayer insulator film 112 are provided so as to cover the fuse electrode 110.

A fourth impurity diffusion region 117 over the second pillar 101c is connected to an interconnect 121 via a third contact plug 119 and a fourth contact plug 120.

The third contact plug 119 and the fuse electrode 110 are insulated from one another by a side wall silicon nitride film 118. Also, a silicon oxide insulating film 103a is provided between a bottom of the side wall silicon nitride film 118 and the upper surface of the second pillar 101c.

The first impurity diffusion region 108a positioned adjacent to the bottom part of the second pillar 101c is connected to an interconnect 115 via a first contact plug 113.

In this case, when forming a semiconductor device having a design rule that has been reduced to 50 nm or smaller, the fuse electrode 110 provided at the outer periphery of the second pillar 101c is a thin film (with a film thickness of around 10 to 30 nm). For this reason, it is difficult to dispose a contact plug for making connection to an interconnect lead for the fuse electrode 110 near the second pillar 101c without shorting with the fourth contact plug 120 and the interconnect 121. Japanese Unexamined Patent Application, First Publication, No. JP-A-2008-300623 discloses that a first pillar 101a is formed so as to be adjacent to the second pillar 101c, for example.

The first pillar 101a is provided within the active region T and adjacent to the second pillar 101c. The first pillar 101a is formed while the second pillar 101c is formed by etching the semiconductor substrate 101. The first pillar 101a is an island-shaped pattern that extends in a prescribed direction (the left-right direction in FIG. 15).

The upper surface of the first pillar 101a is covered by a nitride masking film 103b including silicon nitride, with an intervening silicon oxide film 103a therebetween.

The fuse electrode 110 is provided so as to surround a side surface of the first pillar 101a.

Figure 16:
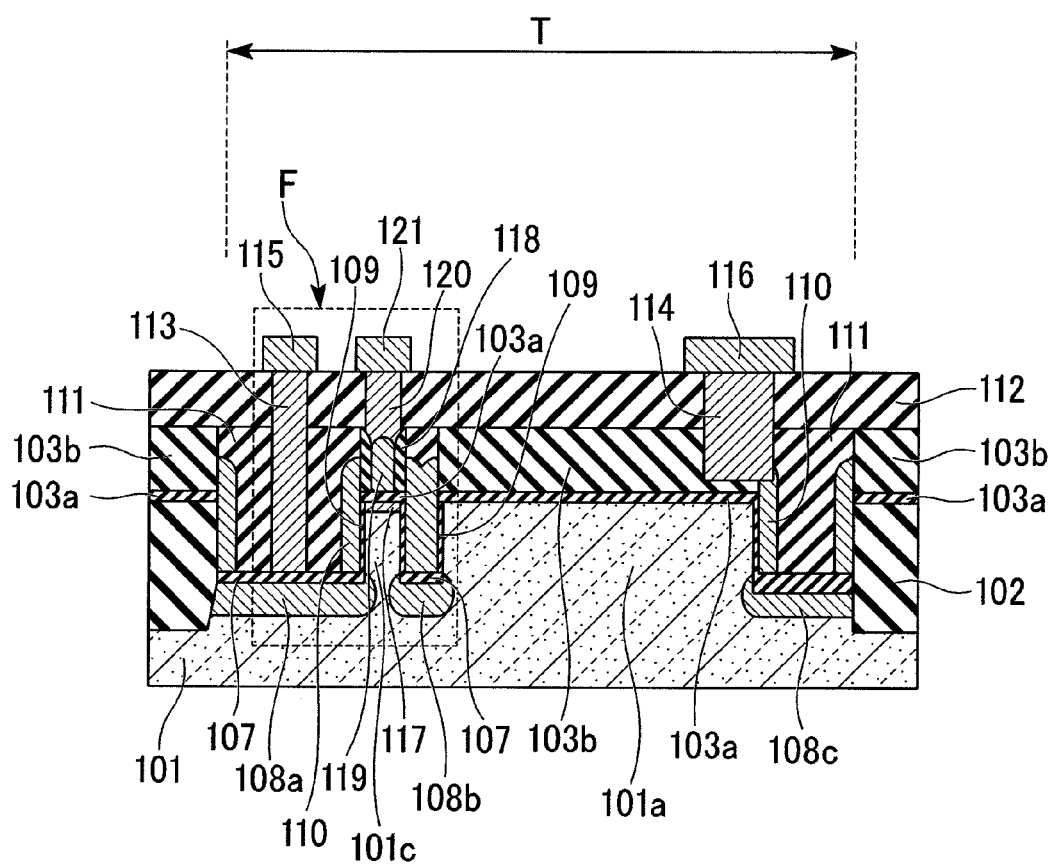
FIG. 16 is a fragmentary cross sectional elevation view, taken along an B-B' line of FIG. 15, illustrating the semiconductor device of FIG. 1 in accordance with the related art.

By adjusting the spacing between the first pillar 101a and the second pillar 101c, it is possible, as shown in FIG. 16, to fill the space adjacent to the first pillar 101a and the second pillar 101c with the fuse electrode 110.

The fuse electrode 110 is formed so as to surround the side surface to the first pillar 101a. There is connected to a second contact plug 114 the fuse electrode 110 which is positioned at an edge of the first pillar 101a opposed to an edge adjacent to the second pillar 101c. The fuse electrode 110 is connected to the interconnect 116 via the second contact plug 114.

A third impurity diffusion region 108c is formed so as to be adjacent to a bottom part on the opposite side of the first pillar 101a.

In the same manner as in the area surrounding of the second pillar 101c, an insulating film 107 is formed on the surface of the semiconductor substrate 101 in the area surrounding the first pillar 101a. The insulating film 107 electrically insulates the third impurity diffusion region 108c from the bottom of the fuse electrode 110.

The isolation region 102 is formed deeper than the first impurity diffusion region 108a, the second impurity diffusion region 108b, and the third impurity diffusion region 108c, so that there is no conductivity between impurity diffusion regions of an active region other than the active region T that adjacently sandwiches the isolation region 102.

With the semiconductor substrate 101, the first impurity diffusion region 108a, the second impurity diffusion region 108b, the third impurity diffusion region 108c and the fourth impurity diffusion region 117 held at a prescribed potential (for example, the ground potential), a high voltage is applied to the fuse electrode 110 via the interconnect 116, thereby destroying the fuse insulating film 109 provided on the side of the second pillar 101c so as to enable the change of the conductivity state. By doing this, the fuse element F functions as an antifuse.

Figure 17:
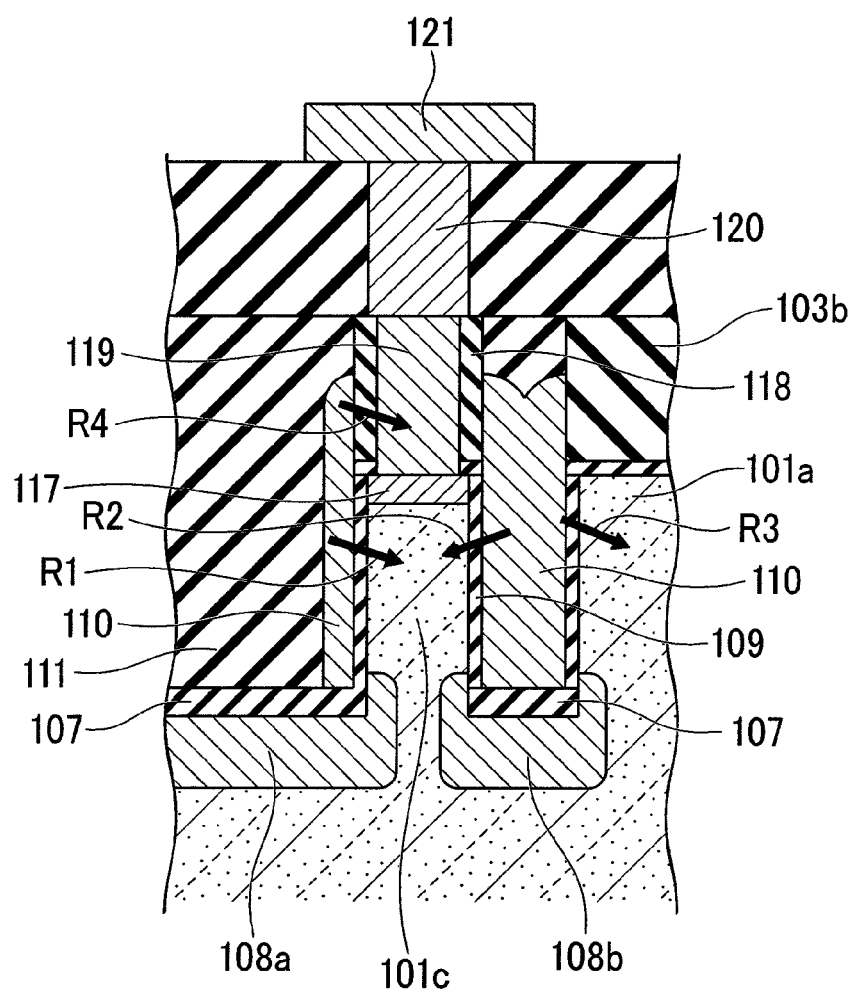
FIG. 17 is a fragmentary enlarged cross sectional elevation view in the proximity of a second pillar of the semiconductor device of FIGS. 15 and 16 in accordance with the related art.

FIG. 17 shows an enlarged fragmentary cross-sectional view in the proximity of the second pillar 101c.

When changing the conductivity state of the antifuse, in the case in which a high voltage is applied between the semiconductor substrate 101 and the fuse electrode 110, a high voltage is applied, via the fuse insulating film 109, to all locations of the fuse electrode 110 that are opposite to the first pillar 101a and the second pillar 101c. For this reason, it is assumed that there is a plurality of paths, R1, R2, R3, and the like, at which the fuse insulating film 109 is destroyed.

Additionally, depending upon the film thickness and film deposition condition of the side wall silicon nitride film 118, a short circuit could occur in the path R4, between the fuse electrode 110 and the third impurity diffusion region 119, via the side wall silicon nitride film 118.

The present inventors have recognized that, in this manner, if the vertical transistor structure is used as is to form an antifuse, there are many paths for destruction of the insulating film, this leading to the variation in the value of resistance in the condition in which the electrodes are shorted (conducting condition). Because variation in the resistance value in the conducting condition of the antifuse can cause a misjudgment regarding the antifuse conducting state when the circuit is operating, this can hinder the prescribed operation of the circuit. For this reason, there is reduced reliability in a semiconductor device that includes an antifuse having the structure of the vertical MOS transistor.

The present inventors have also recognized that, because the n-type fourth impurity diffusion region 117 is formed over the pillar 101c, there may be occur insulation breakdown between the n-type fourth impurity diffusion region 117 and the fuse electrode 110, this leading to instability in the breakdown voltage and the connection resistance after breakdown.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a first island and a first electrode. The first island includes a first semiconductor region, first insulation region, and a first insulating film. The first semiconductor region has first and second side surfaces adjacent to the first insulation region and the first insulating film, respectively. The first electrode is adjacent to the first insulation region and the first insulating film. The first insulating film is between the first electrode and the first semiconductor region.

In some cases, the semiconductor device may include, but is not limited to, the first electrode surrounding the first island.

In some cases, the semiconductor device may include, but is not limited to, the first semiconductor region including a first semiconductor pillar in a first active region, and the first insulation region including a buried insulator in a first isolation region defining the first active region.

In some cases, the semiconductor device may include, but is not limited to, the first insulation region defined by a groove provided in the first isolation region.

In some cases, the semiconductor device may further include, but is not limited to, a first diffusion region adjacent to a bottom of the first semiconductor pillar and a first contact plug coupled to the first diffusion region, the first contact plug being disposed over the first diffusion region.

In some cases, the semiconductor device may include, but is not limited to, the first insulation region having a bottom having a lower level than a bottom of the first diffusion region.

In some cases, the semiconductor device may include, the first semiconductor pillar having substantially the same impurity concentration as the semiconductor substrate and the semiconductor substrate being lower in concentration of the impurity than the first diffusion region.

In some cases, the semiconductor device may further include, but is not limited to, a second contact plug coupled to the first electrode, the second contact plug being disposed over a portion of the first electrode and a portion of the first insulation region.

In some cases, the semiconductor device may include, but is not limited to, the first insulation region having a first side adjacent to the first semiconductor pillar and a second side opposite to the first side and the second contact plug being positioned over the second side of the first insulation region.

In some cases, the semiconductor device may include, but is not limited to, a first distance between the first and second side surfaces of the semiconductor region being shorter than a second distance between the first and second sides of the first insulation regions.

In some cases, the semiconductor device may further include, but is not limited to, a second insulation region, a second active region separated from the first active region by the second insulation region, and a vertical field effect transistor in the second active region.

In some cases, the semiconductor device may further include, but is not limited to, a third contact plug coupled to a gate electrode of the vertical field effect transistor, the third contact plug being disposed over the second insulation region.

In some cases, the semiconductor device may include, but is not limited to, the second insulation region having a first side closer to the vertical field effect transistor and a second side opposite to the first side, and the third contact plug being disposed over the second side of the second insulation region.

In another embodiment, a semiconductor device may include, but is not limited to, a semiconductor pillar, an insulation region, a fuse insulating film, and a fuse electrode. The semiconductor pillar has at least first and second side surfaces. The insulation region is in contact with the first side surface of the semiconductor pillar. The fuse insulating film is in contact with the second side surface of the semiconductor pillar. The fuse electrode is on the second side surface of the semiconductor pillar while the fuse insulating film is interposed between the fuse electrode and the second side surface of the semiconductor pillar.

In still another embodiment, a semiconductor device may include, but is not limited to, a first island, a first diffusion region, a first contact plug, a fuse electrode, and a second contact plug. The first island includes a first semiconductor pillar in a first active region, a first insulation region in a first isolation region, and a fuse insulating film. The first semiconductor pillar has first and second side surfaces adjacent to the first insulation region and the fuse insulating film, respectively. The first diffusion region is adjacent to a bottom of the first semiconductor pillar. The first contact plug is coupled to the first diffusion region. The first contact plug is disposed over the first diffusion region. The fuse electrode surrounds the first island. The second contact plug is coupled to the fuse electrode. The second contact plug is disposed over a portion of the fuse electrode and a portion of the first insulation region.

In some cases, the semiconductor device may include, but is not limited to, the fuse electrode being in contact with the first insulation region and the fuse insulating film, and the fuse insulating film between the fuse electrode and the first semiconductor region.

In some cases, the semiconductor device may include, but is not limited to, the first insulation region having a first side adjacent to the first semiconductor pillar and a second side opposite to the first side, and the second contact plug being positioned over the second side of the first insulation region.

In some cases, the semiconductor device may further include, but is not limited to, a first insulating layer in contact with the entirety of a top surface of the first semiconductor region. The first semiconductor region has the same impurity concentration as a substrate on which the semiconductor device is disposed.

In some cases, the semiconductor device may further include, but is not limited to, a second insulation region, a second active region separated from the first active region by the second insulation region, and a vertical field effect transistor in the second active region.

In some cases, the semiconductor device may further include, but is not limited to, a third contact plug coupled to a gate electrode of the vertical field effect transistor, the third contact plug being disposed over the second insulation region.

Hereinafter, a semiconductor device according to an embodiment of the invention will be described in detail with reference to the drawings.

In the drawings used in the following descriptions, there are cases in which characteristic parts are shown enlarged to facilitate understanding for the sake of convenience, and the dimensional proportions between various constituent elements are not necessarily the same as in reality. Also, the materials, dimensions and the like are exemplary, and the present invention is not necessarily restricted thereto, it being possible to embody variations of the present invention within a scope that does not change the essence thereof.

First Embodiment

Figure 1:
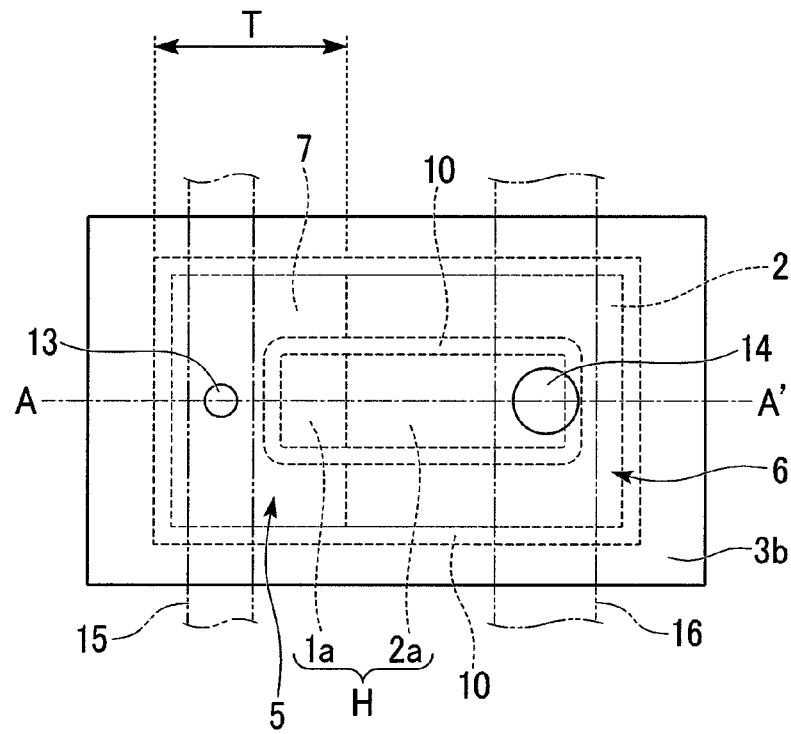
FIG. 1 is a fragmentary plan view illustrating a semiconductor device in accordance with a first embodiment of the present invention.
Figure 2:
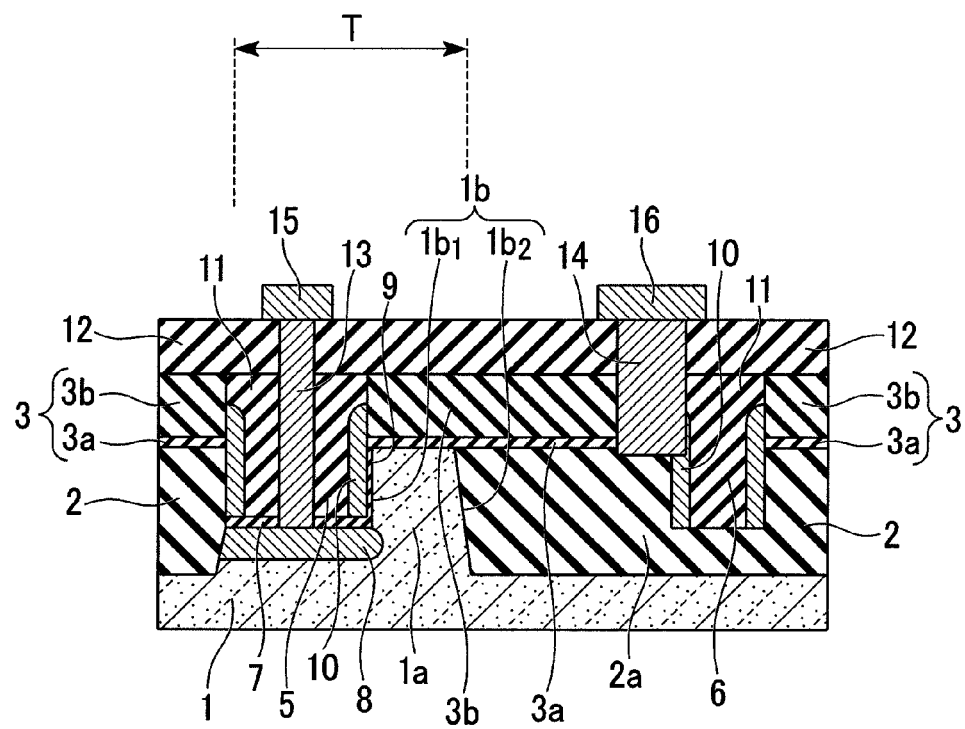
FIG. 2 is a fragmentary cross sectional elevation view, taken along an A-A' line of FIG. 1, illustrating the semiconductor device of FIG. 1 in accordance with the first embodiment of the present invention.

The structure of a semiconductor device according to a first embodiment of the present invention, as shown in FIG. 1 and FIG. 2, will first be described.

FIG. 1 is a fragmentary plan view illustrating a semiconductor device in accordance with a first embodiment of the present invention. FIG. 2 is a fragmentary cross sectional elevation view, taken along an A-A' line of FIG. 1, illustrating the semiconductor device of FIG. 1 in accordance with the first embodiment of the present invention. In FIG. 1, some of the constituent elements are omitted to make the characteristic parts of the semiconductor device more easily visible.

The semiconductor device according to the present embodiment, as shown in FIG. 1 and FIG. 2, is made to function as an antifuse. The semiconductor device may include, but is not limited to, a first pillar 1a, a fuse insulation protruding region 2a, a fuse insulating film 9, and a fuse electrode 10. The first pillar 1a is formed within an active region T of a semiconductor substrate 1. The fuse insulation protruding region 2a is within an isolation region 2 defining the active region T. The fuse insulation protruding region 2a is formed so as to be adjacent to the first pillar 1a. The fuse insulation protruding region 2a is a part of a buried insulator in contact with a first part of a side surface of first pillar 1a. The fuse insulating film 9 covers a second part of a side surface of the first pillar 1a not in contact with the fuse insulation protruding region 2a. The fuse electrode 10 surrounds the first pillar 1a and the fuse insulation protruding region 2a.

A buried insulator that serves as the isolation region 2 is provided on the semiconductor substrate 1, which is made of p-type silicon. The isolation region 2 defines the active region T.

A second trench 6 is formed within the isolation region 2 so that the second trench 6 does not pass through to the bottom surface of the isolation region 2. The fuse insulation protruding region 2a which is the part of the buried insulator defined by the second trench 6 is provided. The fuse insulation protruding region 2a makes contact with the side surface of the first pillar 1a described later, at the boundary with the active region T.

The first pillar 1a is formed within the active region T. The first pillar 1a makes contact with the fuse insulation protruding region 2a. The first pillar 1a is a semiconductor (silicon) region formed by an etching process of the semiconductor substrate 1 within the active region T. The width of the first pillar 1a vertical to a top surface of the first pillar 1a (width in the up-down direction in FIG. 1) is formed so as to be, for example, approximately 50 nm to 100 nm. The first pillar 1a functions as one electrode of the antifuse.

The fuse insulation protruding region 2a and the first pillar 1a form a base part H of a fuse electrode lead. The base part H of the fuse electrode lead is an island-shaped pattern extending in a prescribed direction (left-right direction in FIG. 1). In the present embodiment, the second pillar 101c described above with regard to the related art does not exist. A side surface of the first pillar 1a that does not make contact with the fuse insulation protruding region 2a, which is a part of the base part H of the fuse electrode lead, is a lead of the fuse electrode used to change the conductivity state of the antifuse.

Of the first pillar side surface 1b of the first pillar 1a, a non-fuse region $1b_2$ on the side of the fuse insulation protruding region 2a makes contact with the fuse insulation protruding region 2a. And of the first pillar side surface 1b, the fuse insulating film 9 is formed in a fuse region $1b_1$ that does not contact with the fuse insulation protruding region 2a.

The fuse region $1b_1$, which corresponds to the fuse region of the first pillar 1a, is formed so that the fuse region $1b_1$ is defined by a first trench 5 provided within the active region T. The first trench 5 is designed so as to be shallower than the isolation region 2.

At a location that is the surface of the semiconductor substrate 1 peripheral to the first pillar 1a and also corresponds to the bottom part of the first trench 5, an n-type impurity diffusion region 8 is formed adjacent to the first pillar 1a. The first pillar 1a has the substantially the same impurity concentration as the semiconductor substrate 1. The semiconductor substrate is lower in concentration of the impurity than the n-type impurity diffusion region 8.

The isolation region 2 is formed to be deeper than the impurity diffusion region 8, and so that there is no conductivity between impurity diffusion regions of an active region other than the active region T that adjacently sandwiches the isolation region 2.

A fuse electrode 10 is provided on each of the inner side surfaces of the first trench 5 and the second trench 6 so as to surround the side surface of the base part H of the fuse electrode lead. More specifically, the fuse electrode 10 is formed within the active region T so as to be superimposed with the fuse insulating film 9. That is, the first pillar 1a that serves as one of the fuse electrodes and the fuse electrode 10 sandwich the fuse insulating film 9. The first pillar 1a and the fuse electrode 10 are opposite each other in the fuse region $1b_1$ that is not covered by the fuse insulation protruding region 2a.

A part of the fuse electrode 10 extends along the side surface of the second trench 6 provided in the isolation region 2.

In the active region T, an insulating film 7 is formed on the surface of the semiconductor substrate 1 that corresponds to the upper surface of the impurity diffusion region 8 formed adjacent to the first pillar 1a. Because the fuse electrode 10 is formed over the insulating film 7, the impurity diffusion region 8 and the bottom part of the fuse electrode 10 are electrically insulated.

A first interlayer insulating film 11 including silicon oxide or the like is formed over the insulating film 7. The first interlayer insulating film 11 also fills the inside of the second trench 6 provided in the isolation region 2. The first interlayer insulating film 11 covers the fuse electrodes 10 that are formed on the inner side surfaces of the first trench 5 and the second trench 6.

A silicon oxide insulating film 3a is formed on the upper surfaces of the first pillar 1a and the isolation region 2. Also, a nitride masking film 3b, which includes silicon nitride or the like, is formed over the silicon oxide insulating film 3a. The thickness of the nitride masking film 3b is designed so that it is substantially flush with the upper surface of the first interlayer insulating film 11.

A second interlayer insulating film 12 is formed on the upper surfaces of the first interlayer insulating film 11 and the nitride masking film 3b.

A first contact plug 13 is formed so as to connect to the impurity diffusion region 8. The first contact plug 13 penetrates the first interlayer insulating film 11 and the second interlayer insulating film 12. The upper surface of the first contact plug 13 is designed so that it is substantially flush with the upper surface of the second interlayer insulating film 12.

An interconnect 15 is formed that is above the second interlayer insulating film 12. The interconnect 15 connects with the upper surface of the first contact plug 13. The interconnect 15 functions as a power supply that provides an electrical potential to the impurity diffusion region 8.

A second contact plug 14 is formed on the fuse insulation protruding region 2a. The second contact plug 14 is provided so as not to reach to the bottom surface of the isolation region 2. The upper surface of the second contact plug 14 is designed, in the same manner as the upper surface of the first contact plug 13, so that it is substantially flush with the upper surface of the second interlayer insulating film 12. In the proximity of the second trench 6, the second contact plug 14 is arranged so as to make connection to the fuse electrode 10.

An interconnect 16 is formed that is above the second interlayer insulating film 12. The interconnect 16 connects with the upper surface of the second contact plug 14.

A current path leading to a destruction of the fuse insulating film 9 in the semiconductor device according to the present embodiment will now be described.

First, voltages are applied to the interconnect 15 and the interconnect 16.

When this is done, a prescribed voltage is applied to the semiconductor substrate 1 as well. Specifically, a ground potential (0 V) is applied to the interconnect 15 and the semiconductor substrate 1, and a positive voltage is applied to the interconnect 16.

The voltage applied to the interconnect 15 is applied to the impurity diffusion region 8 via the first contact plug 13. The potential of the impurity diffusion region 8 and the semiconductor substrate are fixed.

The voltage applied to the interconnect 16 is applied to the fuse electrode 10, via the second contact plug 14.

When this is done, in the fuse region $1b_1$, in which the first pillar 1a and the fuse electrode are opposing, destruction occurs to the fuse insulating film 9 and conduction occurs between the first pillar 1a and the fuse electrode 10.

Next, the method of forming the semiconductor device according to the present embodiment is described.

The method of forming the semiconductor device according to the embodiment of the present invention generally includes the following first through third processes. The first process may include, but is not limited to, forming the pillar 1a and the fuse insulation protruding region 2a by etching the semiconductor substrate 1 in the active region T and the buried insulator. The first pillar 1a is upright in the active region T. The fuse insulation protruding region 2a is provided in the isolation region 2. The fuse insulation protruding region 2a is the part of the buried insulator in contact with the part of a first side surface of the first pillar 1a. The buried insulator serves as the isolation region 2 defining the active region T. The second process may include, but is not limited to, forming the fuse insulating film 9. The fuse insulating film 9 covers a second side surface of the first pillar 1a which is not in contact with the fuse insulation protruding region 2a. The third process may include, but is not limited to, forming a fuse electrode 10 that surrounds the outer periphery of the first pillar 1a and the fuse insulation protruding region 2a.

FIG. 3 through FIG. 10 are process diagrams describing one example of a method of forming the semiconductor device according to the present embodiment, by which process steps the semiconductor device shown in FIG. 1 and FIG. 2 is manufactured.

Figure 3:
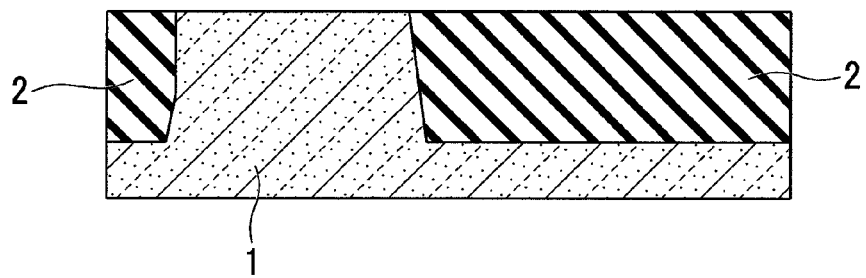
FIG. 3 is a fragmentary cross sectional elevation view illustrating the semiconductor device in a step involved in a method of forming the semiconductor device of FIGS. 1 and 2 in accordance with the first embodiment of the present invention.

The first process is will be described first. FIG. 3 is a fragmentary cross sectional elevation view illustrating the semiconductor device in a step involved in a method of forming the semiconductor device of FIGS. 1 and 2 in accordance with the first embodiment of the present invention.

First, as shown in FIG. 3, an unprocessed semiconductor substrate 1 is prepared. By a photolithography process and a dry etching process, a trench pattern is provided in a region for forming the isolation region 2 on the semiconductor substrate 1.

The trench pattern is filled with the buried insulator. The buried insulator is removed from the top of the semiconductor substrate 1 using CMP (chemical mechanical polishing), leaving the buried insulator within the trench pattern. In this manner, the isolation region 2 is formed. Silicon oxide ($SiO_2$) may be used as the buried insulator.

In this example, a p-type silicon substrate is used as the semiconductor substrate 1.

Figure 4:
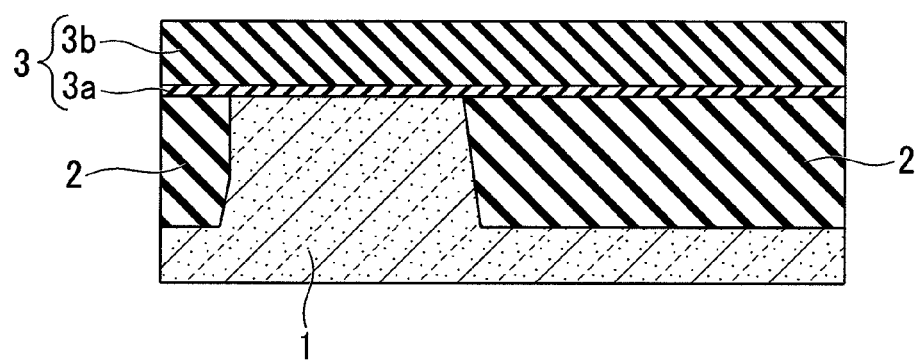
FIG. 4 is a fragmentary cross sectional elevation view illustrating the semiconductor device in a step, subsequent to the step of FIG. 3, involved in the method of forming the semiconductor device of FIGS. 1 and 2 in accordance with the first embodiment of the present invention.

FIG. 4 is a fragmentary cross sectional elevation view illustrating the semiconductor device in a step, subsequent to the step of FIG. 3, involved in the method of forming the semiconductor device of FIGS. 1 and 2 in accordance with the first embodiment of the present invention. As shown in FIG. 4, CVD is used to form the silicon oxide insulating film 3a and the nitride mask film 3b, which includes silicon nitride (Si$_3$N$_4$), so as to cover the semiconductor substrate 1 and the isolation region 2.

In this example, the film thicknesses of the silicon oxide insulating film 3a and the nitride masking film 3b are made approximately 10 nm and 120 nm, respectively. In this specification, the laminated film formed by the silicon oxide insulating film 3a and the nitride masking film 3b will be called the hard mask 3.

Figure 5:
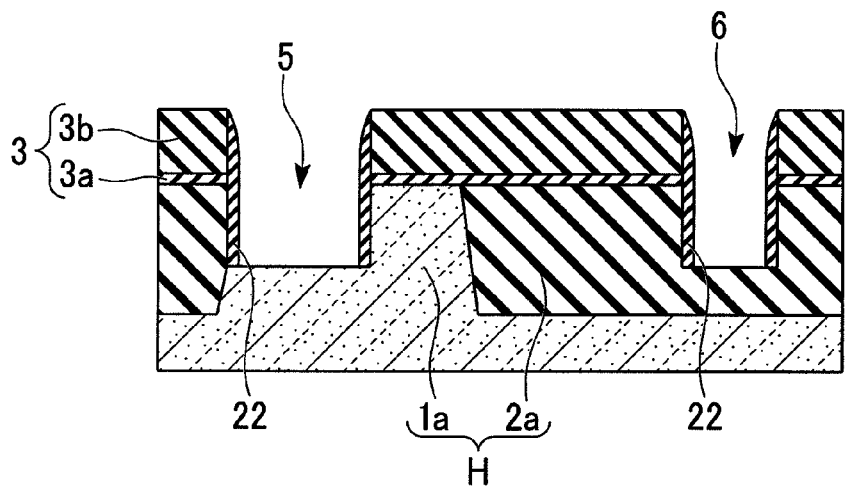
FIG. 5 is a fragmentary cross sectional elevation view illustrating the semiconductor device in a step, subsequent to the step of FIG. 4, involved in the method of forming the semiconductor device of FIGS. 1 and 2 in accordance with the first embodiment of the present invention.

FIG. 5 is a fragmentary cross sectional elevation view illustrating the semiconductor device in a step, subsequent to the step of FIG. 4, involved in the method of forming the semiconductor device of FIGS. 1 and 2 in accordance with the first embodiment of the present invention. As shown in FIG. 5, a photolithography process and a dry etching process are used to pattern the hard mask 3 in the shape of the base part H of the fuse electrode lead formed by the integrating of the first pillar 1a and the fuse insulation protruding region 2a. The base part H of the fuse electrode lead is formed in the shape of an island extending in a prescribed direction (left-right in FIG. 5).

Using the patterned hard mask 3, the semiconductor substrate 1 and the isolation region 2 are dry etched. In performing the dry etching process, silicon etching of the semiconductor substrate 1 and silicon etching of the isolation region 2 may be performed in separate steps.

By doing this, as shown in FIG. 5, in addition to forming the first pillar 1a in the active region T, the first trench 5 is formed so as to cover the outer periphery of the first pillar 1a. An etching amount is controlled so that the bottom part of the first trench 5 does not reach the bottom part of the isolation region 2.

Also, in addition to forming the fuse insulation protruding region 2a in the isolation region 2, the second trench 6 is formed therein so as to cover the outer periphery of the fuse insulation protruding region 2a. An etching amount is controlled so that the buried insulator filling the inside of the trench remains at the bottom part of the second trench 6.

As show in FIG. 5, an oxidation stopper film 22 is formed on the inner side surfaces of the first trench 5 and the second trench 6. These oxidation stopper films 22 are formed by using CVD to deposit silicon nitride films on each of the inner side surfaces of the first trench 5 and the second trench 6. Then, the silicon nitride film is anisotropically etched to a thickness that does not completing fill the first trench 5 and the second trench 6 (in this example, approximately 20 nm), so that the silicon nitride films remain only on the inner side surfaces of the first trench 5 and the second trench 6.

When doing this, the surface (silicon surface) of the semiconductor substrate 1 is in the exposed condition at the bottom part of the first trench 5 in the active region T.

Figure 6:
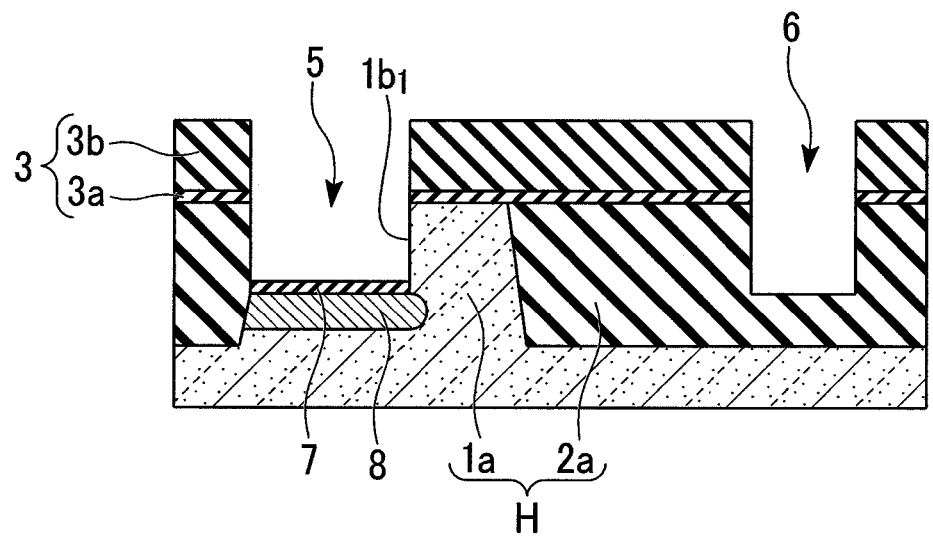
FIG. 6 is a fragmentary cross sectional elevation view illustrating the semiconductor device in a step, subsequent to the step of FIG. 5, involved in the method of forming the semiconductor device of FIGS. 1 and 2 in accordance with the first embodiment of the present invention.

FIG. 6 is a fragmentary cross sectional elevation view illustrating the semiconductor device in a step, subsequent to the step of FIG. 5, involved in the method of forming the semiconductor device of FIGS. 1 and 2 in accordance with the first embodiment of the present invention.

As shown in FIG. 6, the insulating film 7 including silicon oxide is formed by thermal oxidation on the bottom surface of the first trench 5, which is the exposed part of the semiconductor substrate 1. When this is done, because the oxidation stopper film 22 is formed in the fuse region 1b$_1$, which is not in contact with the fuse insulation protruding region 2a, on the second side surface of the first pillar 1a, the second side surface of the first pillar 1a is not oxidized. Additionally, because the hard mask 3 is formed on the upper surface of the first pillar 1a, the upper surface of the first pillar 1a is not oxidized. The film thickness of the insulating film 7 is preferably approximately 30 nm to 50 nm.

Using ion implantation, an n-type impurity, such as arsenic (As) is diffused into the surface of the semiconductor substrate 1 corresponding to the bottom surface of the first trench 5, to form the impurity diffusion region 8. The n-type impurity in the impurity diffusion region 8 is diffused by heat applied during subsequence forming process steps. The impurity diffusion region 8 is formed so as to have a broadening from the bottom surface of the first trench 5 toward the first pillar 1a. Annealing may be performed in a nitrogen atmosphere immediately after performing the ion implantation.

An impurity concentration in the impurity diffusion region 8 is set so that an impurity concentration ultimately diffused into the first pillar 1a is such that the diffusion layer resistance required as a device is satisfied. The ion implantation dose for the impurity diffusion region 8 is set so that such an impurity concentration ultimately diffused into the first pillar 1a is obtained. When performing the ion implantation of the impurity, the implantation energy, the depth of the region for formation of the isolation region 2, and the depth of the first trench 5 must be set so that the impurity is not introduced into the semiconductor substrate 1 below the isolation region 2. Also, the first trench 5 is formed shallower than the trench depth of the isolation region 2, so that there is no shorting via the impurity diffusion region 8 with other elements neighboring the active region T.

In this example, the implantation energy is 5 keV, but is not limited thereto. In this example, the dose is $1 \times 10^{15}$ to $5 \times 10^{15}$ atoms/cm$^2$, but is not limited thereto.

Wet etching process using hot phosphoric acid is performed to remove the oxidation stopper films 22 that were formed on the inner side surfaces of the first trench 5 and the second trench 6. When this is done, because the nitride masking film 3b is simultaneously etched, the wet etching time is adjusted so that the nitride masking film 3b remains after the wet etching process.

A natural oxide film formed on the side surfaces of the first pillar 1a is removed by a wet etching process using dilute hydrofluoric acid (HF), so as to expose the clean silicon surface of the semiconductor substrate 1. When this is done, because the insulating film 7 is simultaneously etched, the wet etching time is adjusted so that the insulating film 7 remains after the wet etching process.

Next, the second step will be described.

Figure 7:
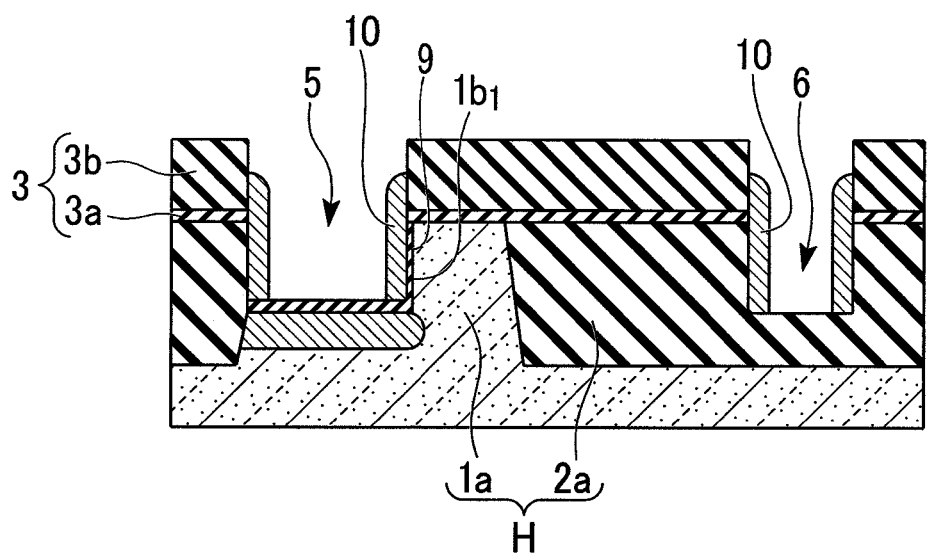
FIG. 7 is a fragmentary cross sectional elevation view illustrating the semiconductor device in a step, subsequent to the step of FIG. 6, involved in the method of forming the semiconductor device of FIGS. 1 and 2 in accordance with the first embodiment of the present invention.

FIG. 7 is a fragmentary cross sectional elevation view illustrating the semiconductor device in a step, subsequent to the step of FIG. 6, involved in the method of forming the semiconductor device of FIGS. 1 and 2 in accordance with the first embodiment of the present invention. As shown in FIG. 7, by thermal oxidizing the fuse region 1b$_1$ at which the semiconductor substrate 1 is exposed by thermal oxidation, the fuse insulating film 9 including silicon oxide is formed in the fuse region 1b$_1$. When doing this, the film thickness of the fuse insulating film 9 is preferably approximately 4 nm to 6 nm.

Next, the third step will be described.

As shown in FIG. 7, after depositing an impurity-containing polysilicon with a thickness of approximately 20 nm on the surfaces of the mask 3, the first trench 5 and the second trench 6 using CVD, an anisotropic etching process is done. By doing this, the polysilicon deposited on the bottom parts of the first trench 5 and the second trench 6 is removed, and the fuse electrode 10 is formed by separating the polysilicon on each of the inner side surfaces of the first trench 5 and the second trench 6. That is, the fuse electrode 10 is formed on the side surface of the base part H of a fuse electrode lead.

In this case, the widths of the first trench 5 and the second trench 6 are set beforehand so that they will be 2 or more times the film thickness of the fuse electrode 10, so that the insides of the first trench 5 and the second trench 6 are not completely filled by the fuse electrode 10. Although polysilicon remains on the side surface of the isolation region 2, this polysilicon does not function as the fuse electrode.

A metal film of tungsten (W) or the like or a laminate of polysilicon and a metal film may be used as the material of the fuse electrode 10.

Figure 8:
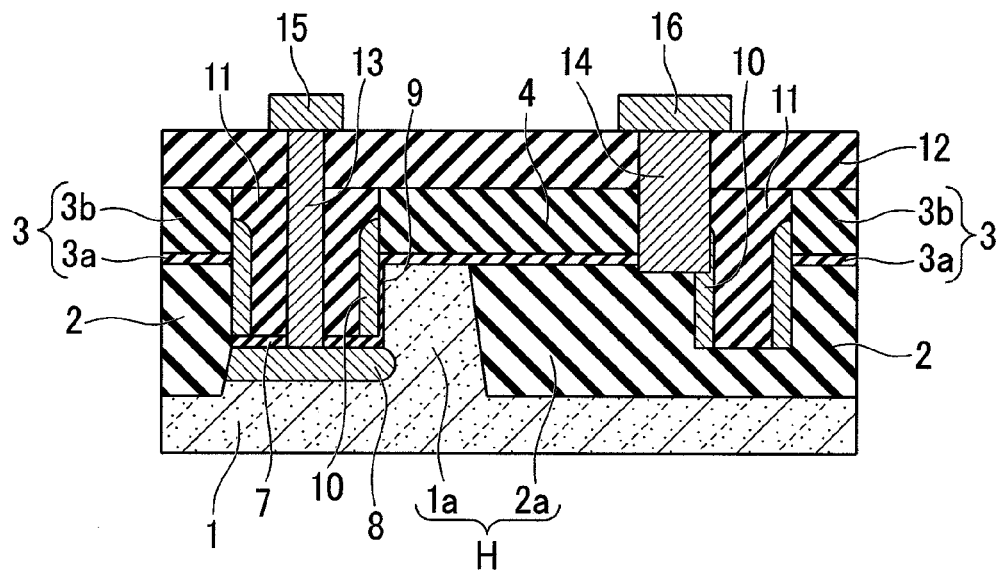
FIG. 8 is a fragmentary cross sectional elevation view illustrating the semiconductor device in a step, subsequent to the step of FIG. 7, involved in the method of forming the semiconductor device of FIGS. 1 and 2 in accordance with the first embodiment of the present invention.

FIG. 8 is a fragmentary cross sectional elevation view illustrating the semiconductor device in a step, subsequent to the step of FIG. 7, involved in the method of forming the semiconductor device of FIGS. 1 and 2 in accordance with the first embodiment of the present invention. As shown in FIG. 8, after CVD is used to deposit silicon oxide to a depth sufficient to fill the first trench 5 and the second trench 6, as the deposited silicon oxide surface is polished using CMP, planarization is done until the surface of the nitride masking film 3b that acts as a stopper is shown. By doing this, the first interlayer insulating film 11 including silicon oxide is deposited in the first trench 5 and the second trench 6

After the above, CVD is used to deposit the second interlayer insulating film 12 including silicon oxide over the first interlayer insulating film 11 and the nitride masking film 3b.

Rather than separating the steps of forming the first interlayer insulating film 11 and the second interlayer insulating film 12, deposition thereof may be done in a single step.

Within a region of the fuse insulation protruding region 2a, the second contact plug 14 is formed, which penetrates the second interlayer insulating film 12 and the nitride masking film 3b. The second contact plug 14 is conductive with the fuse electrode 10 formed on the side surface of the fuse insulation protruding region 2a. When doing this, the upper surface of the second contact plug 14 is substantially flush with the upper surface of the second interlayer insulating film 12. Additionally, the second contact plug 14 is disposed in a position that does not short to the first contact plug, which is described later. The second contact plug 14 may reach the silicon oxide insulating film 3a and the silicon oxide of the isolation region 2.

The first contact plug 13 is formed, which penetrates the second interlayer insulating film 12, the first interlayer insulating film 11, and the insulating film 7. The first contact plug 13 is conductive with respect to the impurity diffusion region 8. When doing this, the upper surface of the first contact plug 13 is substantially flush with the upper surface of the second interlayer insulating film 12. The width of the first contact plug 13 is designed so that it does not make contact with the fuse electrode 10 formed on the inner side surface of the first trench 5.

In this embodiment, titanium (Ti), titanium nitride (TiN), tungsten (W) sequentially deposited in a laminate can be cited as an example of the material of the second contact plug 14 and the first contact plug 13. However, the material of the second contact plug 14 and the first contact plug 13 is not limited thereto.

The second contact plug 14 and the first contact plug 13 may be formed in the same step. In the case of forming the second contact plug 14 and the first contact plug 13 in the same step, the difference in etching rates between the silicon nitride film and the silicon oxide film is used in setting the etching conditions so that the second contact plug 14 does not penetrate the isolation region 2 and reach the semiconductor substrate 1.

The interconnect 16 connecting with the second contact plug 14 and the interconnect 15 connecting with the first contact plug 13 are formed, using a metal film. Examples of the material of the metal film include tungsten (W), aluminum (Al), and copper (Cu). However, the material of the metal film is not limited thereto.

The above-described steps can be used to form a semiconductor device of the present embodiment, such as shown in FIG. 1 and FIG. 2.

As described above, in the antifuse to which the semiconductor device according to the present embodiment is applied, the fuse insulating film 9 is destroyed by the following processes. The semiconductor substrate 1 and the impurity diffusion region 8 are held at a prescribed potential (for example, the ground potential). A high voltage is applied to the fuse electrode 10 via the interconnect 16. By doing these, there is accomplished a change in the conducting state of the antifuse, which had been in the initial condition of the nonconducting state.

Figure 9:
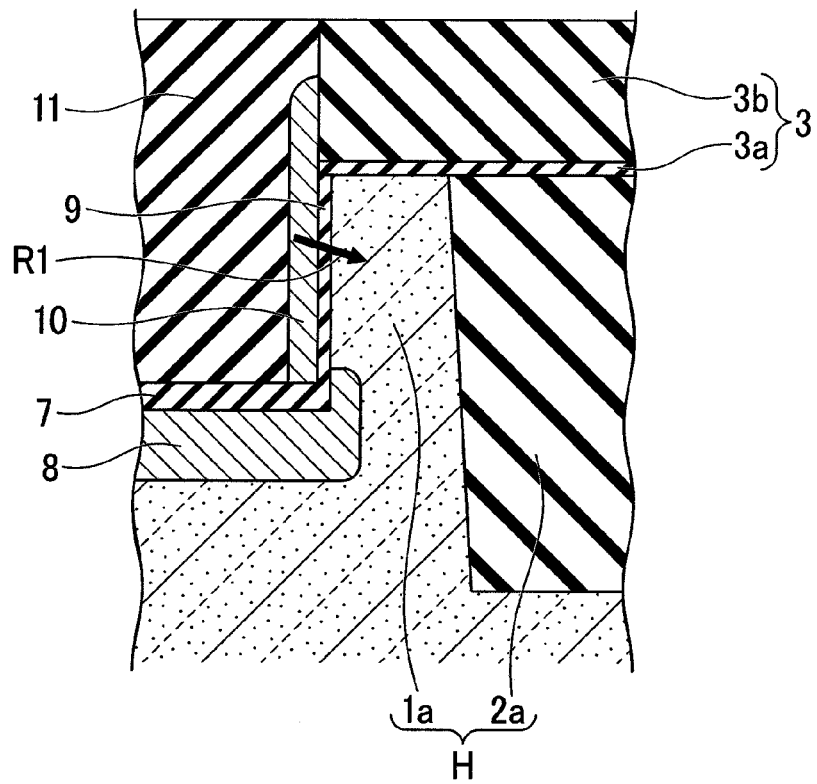
FIG. 9 is a fragmentary enlarged cross sectional elevation view in the proximity of a first pillar of the semiconductor device of FIGS. 1 and 2 in accordance with the first embodiment of the present invention.

FIG. 9 is a fragmentary enlarged cross sectional elevation view in the proximity of the first pillar 1a of the antifuse of FIGS. 1 and 2 in accordance with the first embodiment of the present invention.

In the present embodiment, the site at which the fuse electrode 10 is shorted with the first pillar 1a by the destruction of the fuse insulating film 9 is only at the side surface of the first pillar 1a that does not make contact with the fuse insulation protruding region 2a, which is a part of the base part H of the fuse electrode lead. For this reason, destruction of the fuse insulating film 9 occurs only at the path R1 shown in FIG. 9, enabling stabilization of the resistance value in the conducting state. By doing this, it is possible to solve reduced reliability of the semiconductor device incorporating the antifuse having the structure of the vertical MOS transistor in the related art. It is additionally possible to easy to form the semiconductor device having stable operation.

The impurity diffusion region 117 and the contact plug 119 connected thereto, which are provided in the antifuse in the related art, are not formed at the upper part of the first pillar 1a of the antifuse according to the present embodiment. By doing this, it is possible to prevent instability in the breakdown voltage and connection resistance caused by shorting (path R4 in FIG. 17) by destruction of the side wall silicon nitride film 118 between the fuse electrode 110 and the contact plug 119, which may occur in the structure of the antifuse in the related art. Additionally, the occurrence of insulation destruction between the fuse electrode 110 and the impurity diffusion region 117 positioned at the upper part of the second pillar 101c is also eliminated.

When, as in the antifuse in the related art shown in FIG. 16, there is the impurity diffusion region 117 at the upper part of the second pillar 101c, it is difficult to observe and identify the site of destruction of the fuse insulating film 109. At the stage of developing prototypes of the semiconductor device having the antifuse, the observation of the site of destruction of the insulating film using an electron microscope is an important development way. With regard to the antifuse that uses as is the structure of the vertical MOS transistor having a three-dimensional structure in the related art, a large number of presumed destruction paths, as described above, existed. It is difficult to observe the antifuse because of its complex three-dimensional structure. In the case of a plurality of presumed destruction paths, there is a difficulty in identifying the site of the destruction of the insulating film.

In contrast, in the present embodiment, because the site of the occurrence of insulating film destruction is limited, it is easy to use the electron microscope as a means of observation and to identify the site of destruction of the fuse insulating film 9 of the antifuse.

Figure 10:
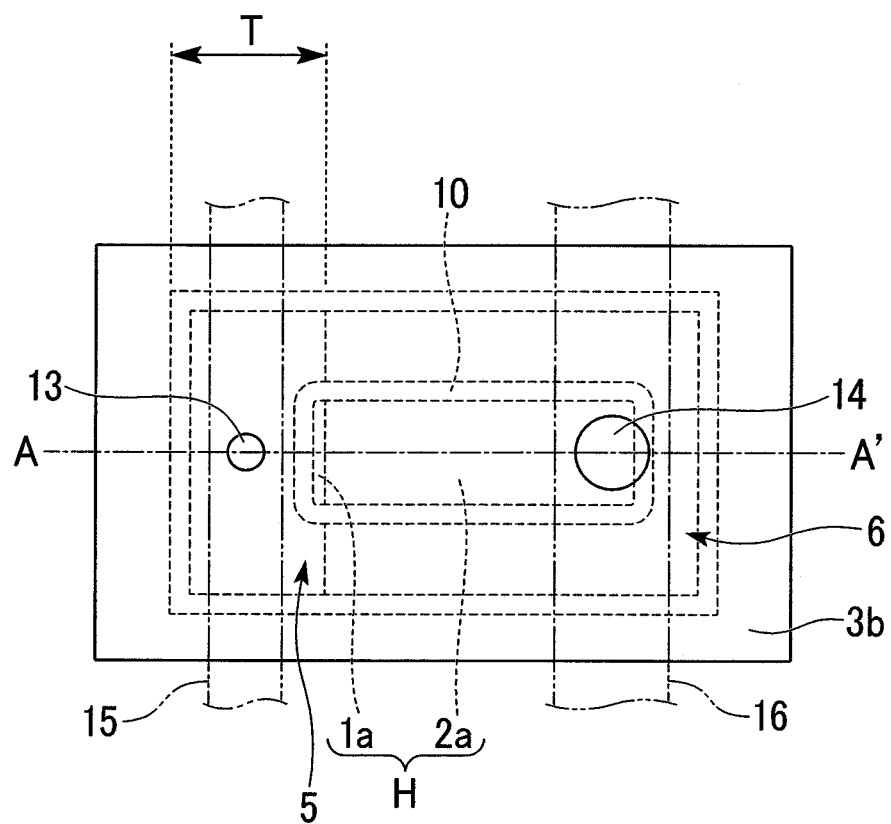
FIG. 10 is a fragmentary plan view illustrating a semiconductor device in accordance with the first embodiment of the present invention.

Additionally, as shown in FIG. 10, when seen in plan view manner, the distance between the first side surface of the first pillar 1a facing the fuse insulation protruding region 2a and the second side surface of the first pillar 1a opposed to the first side surface is shorter than the distance between the first side surface of the first pillar 1a and a first side surface of the fuse insulation protruding region 2a adjacent to the second contact plug 14. In the case in which the overlapping part between the base part H of the fuse electrode lead and the active region T, that is, the width of the first pillar 1a (the left-right direction in FIG. 10) is made as narrow as possible, it is possible to more effectively identify the site of destruction of the fuse insulating film 9 of the antifuse. By making the site at which the insulation film destruction occurs narrow, it is possible to further stabilize the resistance value in the conducting state.

Second Embodiment

The structure of a semiconductor device that is a second embodiment of the present invention will now be described.

Figure 11:
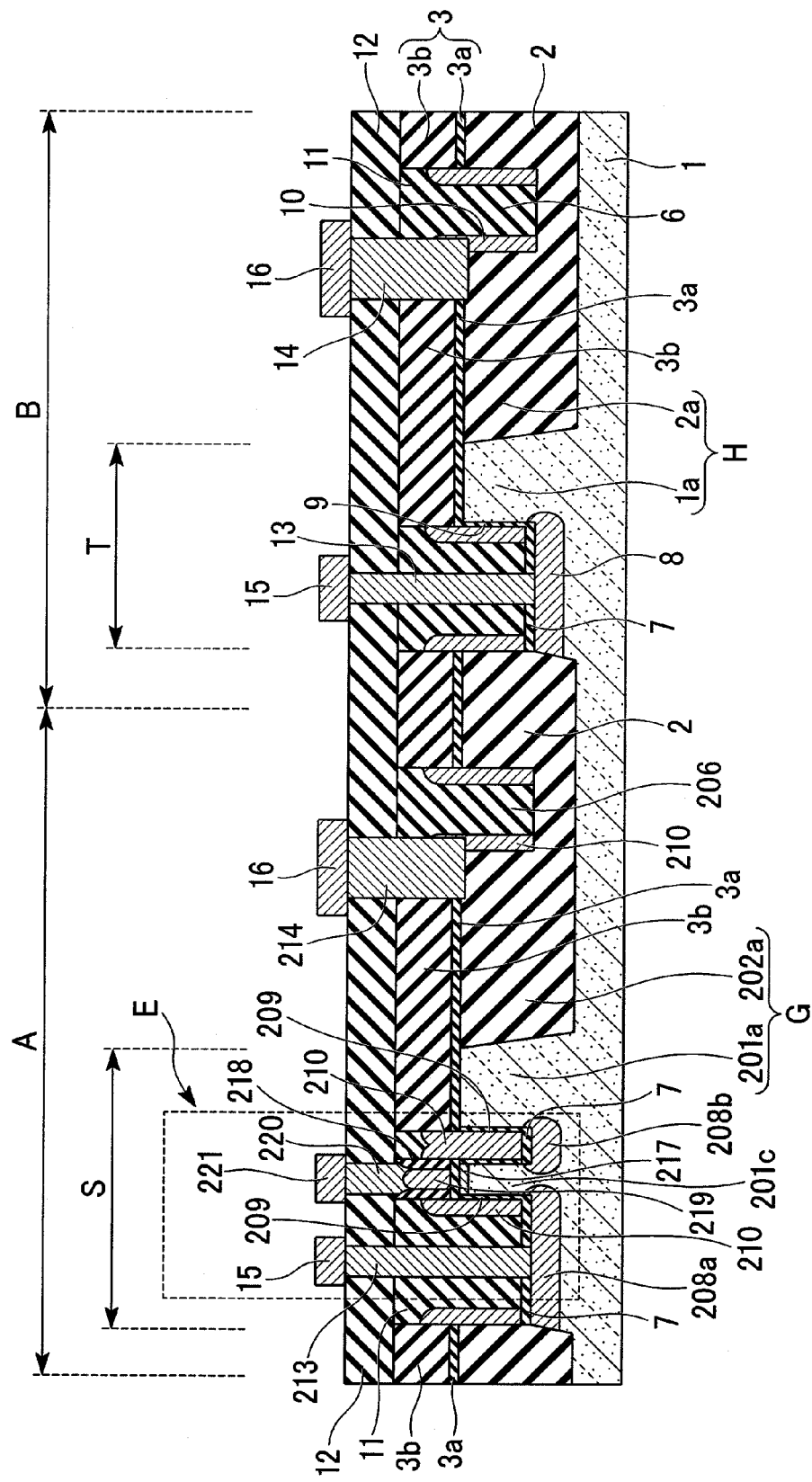
FIG. 11 is a fragmentary cross sectional elevation view illustrating a semiconductor device in accordance with a second embodiment of the present invention.

FIG. 11 is a fragmentary cross sectional elevation view illustrating a semiconductor device in accordance with the second embodiment of the present invention.

The same parts as those of the semiconductor device in the first embodiment are denoted by the same reference numerals in the drawings.

As shown in FIG. 11, in the semiconductor device according to the present embodiment may include, but is not limited to, an antifuse B according to the present embodiment and a transistor element A including a vertical MOS transistor E on a semiconductor substrate 1. The antifuse B and transistor element A are adjacent to on another. That is, the vertical MOS transistor E is formed in an active region S separate from the active region T in which the antifuse B is formed on the semiconductor substrate 1.

A gate electrode contact plug 214 is disposed on a transistor insulating film protruding region 202a so as to be adjacent to the vertical MOS transistor E. The gate electrode contact plug 214 supplies electrical power to a gate electrode 210 of the vertical MOS transistor E. The gate electrode contact plug 214 is disposed at a first end part of the transistor insulating film protruding region 202a. The first end part of the transistor insulating film protruding region 202a is positioned on the side opposite from a second end part that opposes a channel region pillar 201c of the vertical MOS transistor E in the direction of the transistor insulating film protruding region 202a.

The structure of the transistor element A is substantially the same as that of the antifuse B, with the exception of the differences in the active region S and the active region T.

As shown in FIG. 11, the transistor element A including the vertical MOS transistor E and the antifuse B that uses the semiconductor device of the present embodiment is formed in the semiconductor substrate 1.

The transistor element A and the antifuse B are defined by an isolation region 2 formed adjacently to an impurity diffusion region 8.

Within the region of the transistor element A, a buried insulator that will serve as the isolation region 2 is provided on the semiconductor substrate 1 in the same manner as the antifuse B. The active region S is defined by the isolation region 2.

In the same manner as the antifuse B, a second trench 206 is formed in the isolation region 2 of the transistor element A so that it does not pass through to the bottom surface of the isolation region 2. The transistor insulating film protruding region 202a is formed from the buried insulator that is defined by the second trench 206. The transistor insulating film protruding region 202a is in contact with a first side surface of a first pillar 201a, which is described later, at the boundary with the active region S.

The first pillar 201a, which is substantially the same as the first pillar 1a in the antifuse B, is formed within the active region S. The first pillar 201a is in contact with the transistor insulating film protruding region 202a.

The transistor insulating film protruding region 202a and the first pillar 201a form a base part G of a gate electrode lead. In this manner, in the transistor element A as well, the configuration is the same as described regarding the first embodiment, in which the first pillar 1a and the fuse insulation protruding region 2a form the base part H of the fuse electrode lead.

Also, the channel region pillar 201c, which serves as the channel region sandwiched between the source and drain electrodes is formed within the active region S.

The channel region pillar 201c is disposed on the opposite side from the transistor insulation protruding part 20a, so as to sandwich the first pillar 201a.

The channel region pillar 201c and the base part G of the gate electrode lead are disposed so that they are at separated, with a space of a prescribed width therebetween. The width is set so that the space is filled by a gate electrode 210, which will be described later, with a prescribed film thickness.

Of the side surface of the first pillar 201a, the gate insulating film 209 is formed on a first side surface in contact with the transistor insulation protruding region 202a and on a second side surface of the channel region pillar 201c.

A first impurity diffusion region 208a and a second impurity diffusion region 208b are provided below the channel region pillar 201c. A fourth impurity diffusion region 217 is provided at an upper portion of the channel region pillar 201c. The second impurity diffusion region 208b is formed in the semiconductor substrate 1 between the first pillar 201a and the channel region pillar 201c. The first impurity diffusion region 208a is formed in the semiconductor substrate 1 on the opposite side of the channel region pillar 201c from the second impurity diffusion region 208b. The first impurity diffusion region 208a does not make contact with the second impurity diffusion region 208b.

The gate electrode 210 is formed so as to surround the side surface of the channel region pillar 201c and the side surface of the base part G of the gate electrode lead. When doing this, the gate electrode 210 is formed so as to overlap with the gate insulating film 209 in the active region S.

The area between the channel region pillar 201c and the base part G of the gate electrode lead is filled by the gate electrode 210.

In the active region S, an insulating film 7 is formed over the surface of the semiconductor substrate 1 corresponding to the upper surface of the first impurity diffusion region 208a and the second impurity diffusion region 208b formed below the channel region pillar 201c. Because the gate electrode 210 is formed over the insulating film 7, the first impurity diffusion region 208a and the second impurity diffusion region 208b are electrically insulated from the gate electrode 210.

In the same manner as the antifuse B, the first interlayer insulating film 11 including silicon oxide or the like is formed over the insulating film 7 in the transistor element A. The first interlayer insulating film 11 is filled, even in the second trench 206 provided in the isolation region 2. The gate electrode 210 is covered by the first interlayer insulating film 11.

A silicon oxide insulating film 3a is formed on the upper surfaces of the first pillar 201a, the isolation region 2, and the channel region pillar 201c. Also, a nitride masking film 3b, which includes silicon nitride or the like, is formed over the silicon oxide insulating film 3a formed on the upper surfaces of the first pillar 201a and the isolation region 2. The film thickness of the nitride masking film 3b is designed so that the nitride masking film 3b is substantially flush with the upper surface of the first interlayer insulating film 11.

The fourth impurity diffusion region 217 positioned at the upper part of the channel region pillar 201c is connected to the interconnect 221 via the third contact plug 219 and the fourth contact plug 220. The third contact plug 219 and the gate electrode 210 are insulated by a side wall silicon nitride film 218 surrounding the third contact plug 219. The side wall silicon nitride film 218 is disposed over the silicon oxide insulating film 3a.

A second interlayer insulating film 12 is formed on the upper surface of the first interlayer insulating film 11 and the nitride masking film 3b.

A source contact plug 213 is formed so as to connect to the first impurity diffusion region 208a. The source contact plug 213 penetrates the first interlayer insulating film 11 and the second interlayer insulating film 12. The upper surface of the source contact plug 213 is designed to be substantially flush with the upper surface of the second interlayer insulating film 12.

An interconnect 15 is provided over the second interlayer insulating film 12. The interconnect 15 connects to the upper surface of the source contact plug 213. The interconnect 15 functions as a source of electrical power that applies an electrical potential to the first impurity diffusion region 208a.

The gate electrode contact plug 214 is provided in the transistor insulation protruding region 202a. The transistor insulation protruding region 202a is disposed so as to be adjacent to the vertical MOS transistor E. The gate electrode contact plug 214 is connected to the vertical MOS transistor E. The gate electrode contact plug 214 supplies electrical power to the gate electrode 210. The gate electrode 210 is provided in the outer periphery of the channel region pillar 201c. The gate electrode contact plug 214 is disposed at the first end part of the transistor insulation protruding region 202a. The first end part of the transistor insulating film protruding region 202a is positioned on the side opposite from the second end part that opposes the channel region pillar 201c of the vertical MOS transistor E in the direction of the transistor insulating film protruding region 202a.

The gate electrode contact plug 214 is provided so that it does not reach the bottom surface of the isolation region 2.

The interconnect 16 connected with the upper surface of the gate electrode contact plug 214 is formed over the second interlayer insulating film 12. The interconnect 16 supplies electrical power to the gate electrode 210, via the gate electrode contact plug 214.

A method for forming of the semiconductor device according to the second embodiment will be described.

Figure 12:
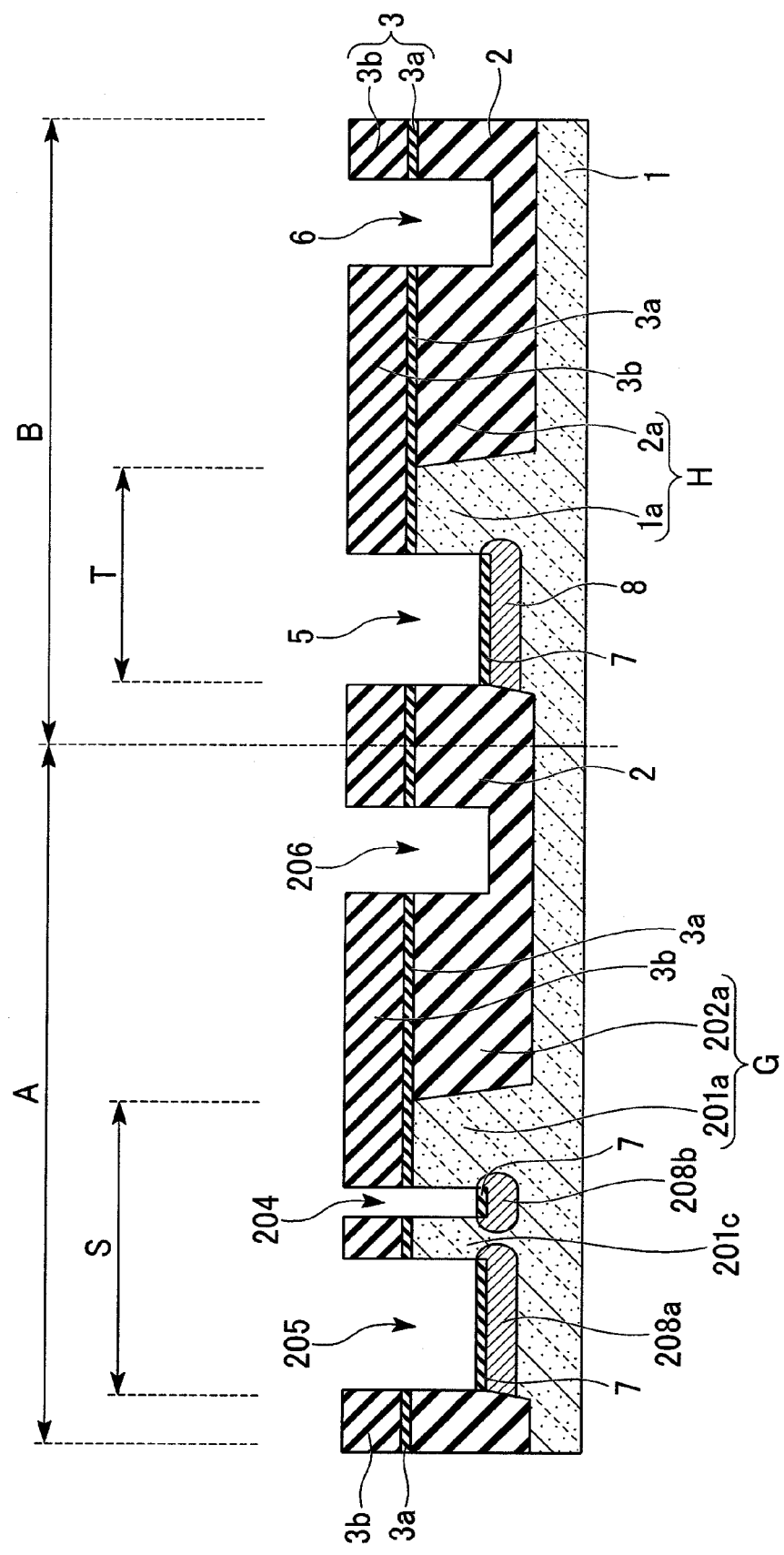
FIG. 12 is a fragmentary cross sectional elevation view illustrating the semiconductor device in a step involved in a method of forming the semiconductor device of FIG. 11 in accordance with the second embodiment of the present invention.
Figure 13:
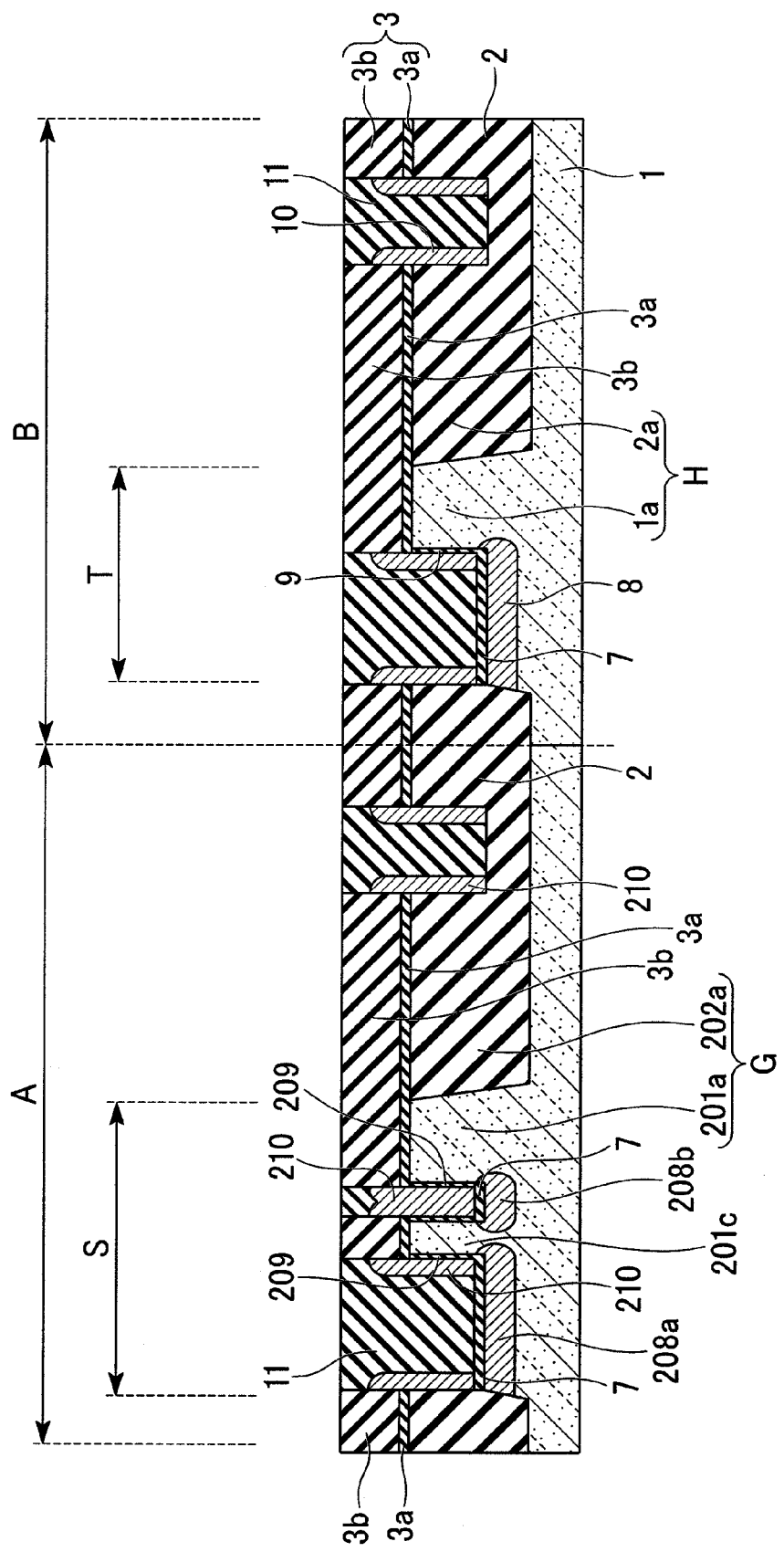
FIG. 13 is a fragmentary cross sectional elevation view illustrating the semiconductor device in a step, subsequent to the step of FIG. 12, involved in the method of forming the semiconductor device of FIG. 11 in accordance with the second embodiment of the present invention.
Figure 14:
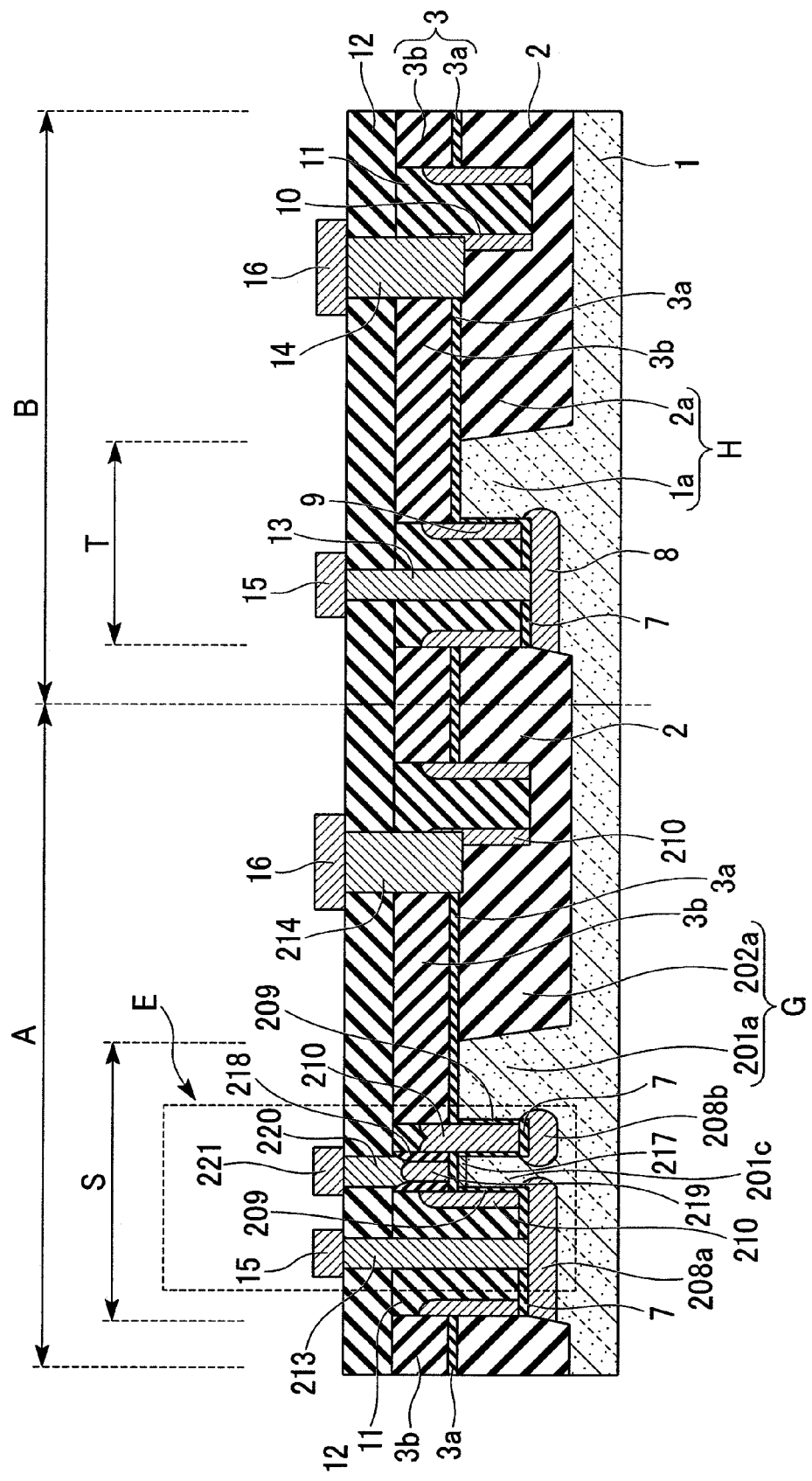
FIG. 14 is a fragmentary cross sectional elevation view illustrating the semiconductor device in a step, subsequent to the step of FIG. 13, involved in the method of forming the semiconductor device of FIG. 11 in accordance with the second embodiment of the present invention.

FIG. 12 to FIG. 14 are fragmentary cross sectional elevation views illustrating the semiconductor device in a step involved in a method of forming the semiconductor device of FIG. 11 in accordance with the second embodiment of the present invention.

The method for forming the semiconductor device of the present embodiment may include, but is not limited to, the following processes. In the first step of the method for forming the semiconductor device according to the first embodiment, the channel region pillar 201c of the vertical MOS transistor E is formed by etching the semiconductor substrate 1 within the active region S separately from the active region T while the first pillar 1a is formed by etching the semiconductor substrate 1. In the third step of the method for forming the semiconductor device according to the first embodiment, the gate electrode 210 of the vertical MOS transistor E is formed while the fuse electrode 10 is formed.

In the method for forming the semiconductor device according to the present embodiment, the antifuse using the semiconductor device according to the first embodiment and the transistor element A including the vertical MOS transistor E are adjacently formed on the semiconductor substrate 1. Also, the transistor element A including the vertical MOS transistor E is formed while the antifuse using the semiconductor device according to the first embodiment is formed.

The same parts as those of the semiconductor device in the first embodiment are denoted by the same reference numerals in FIG. 12 to FIG. 14.

First, the first step, in which the first pillar 1a is formed while the channel region pillar 201c of the vertical MOS transistor E is formed in the active region S will be described, referring to FIG. 12.

As shown in FIG. 12, to the semiconductor device 1, a trench pattern is provided in a region for forming the isolation region 2 on the semiconductor substrate 1 by a photolithography process and a dry etching process.

The isolation region 2 is formed by filling the trench pattern with the buried insulator. A region of the transistor element A and a region of the antifuse B are defined by the isolation region 2.

The silicon oxide insulating film 3a and the nitride masking film 3b which includes silicon nitride are formed using CVD, so as to cover the upper surface of the semiconductor substrate 1 and the isolation region 2. In this example, in the same manner as in the first embodiment, the film thicknesses of the silicon oxide insulating film 3a and the nitride masking film 3b are made approximately 10 nm and 120 nm, respectively. However, the film thickness of the silicon oxide insulating film 3a and the nitride masking film 3b are not limited thereto.

The hard mask 3 is patterned in the shape of the base part H of the fuse electrode lead in the region of antifuse B while the hard mask 3 is patterned in the shape of the base part G of the gate electrode lead and in the shape of the channel region pillar 201c in the region of transistor element A. The first pillar 201a and the transistor insulating film protruding region 202a form the base part G of the gate electrode lead.

The base part H of the fuse electrode lead and the base part G of the gate electrode lead are an island-shaped pattern that extends in the prescribed direction (the left-right direction in FIG. 12).

A dry etching process of the semiconductor substrate 1 and the isolation region 2 is performed using the patterned hard mask 3 in the regions of both the antifuse B and the transistor element A.

By doing this, as shown in FIG. 12, while forming the first pillar 1a in the active region T, the first trench 5 is formed so as to surround the outer periphery of the first pillar 1a. Also, while forming the first pillar 1a, the channel region pillar 201c of the vertical MOS transistor E and the first pillar 201a are formed in the active region S. While forming the first pillar 1a, the third trench 204 is formed so as to surround the outer periphery of the first pillar 201a. While forming the first pillar 1a, the first trench 205 is formed so as to surround the outer periphery of the channel region pillar 201c.

Also, while forming the fuse insulation protruding region 2a in the isolation region 2 of the antifuse B, the second trench 6 is formed so as to surround the fuse insulation protruding region 2a. Further, while forming the fuse insulation protruding region 2a, the transistor insulating protruding film region 202a in the isolation region 2 of the transistor element A is formed, and also the second trench 206 is formed so as to cover the transistor insulating film protruding region 202a Also, the active region T and the active region S are defined by the formed fuse insulation protruding region 2a and the transistor insulating film protruding region 202a.

In the same manner as in the method for forming in the first embodiment, while an oxidation stopper film is formed so as to cover an area surrounding of the base part H of the fuse electrode lead, the oxidation stopper film is formed in an area surrounding the base part G of the gate electrode lead and the channel region pillar 201c in the region of the transistor element A as well.

In the active region T and the active region S, an insulating film 7 which includes oxide silicon is formed on the part of the surface of the semiconductor substrate 1, which is exposed from the oxidation stopper film. Also, in the active region T an impurity diffusion region 8 is formed on the surface of the semiconductor substrate 1 corresponding to the lower part of the insulating film 7. Also, in the active region S, the first impurity diffusion region 208a and the second impurity diffusion region 208b are formed below the channel region pillar 201c. At this time, the second impurity diffusion region 208b is disposed below the first pillar 201a and the channel region pillar 201c. The second impurity diffusion region 208b is formed in the semiconductor substrate 1 between the first pillar 201a and the channel region pillar 201c. The first impurity diffusion region 208a is formed in the semiconductor substrate 1 on the opposite side of the channel region pillar 201c from the second impurity diffusion region 208b. The first impurity diffusion region 208a does not make contact with the second impurity diffusion region 208b.

The method for forming the insulating film 7, the impurity diffusion region 8, the first impurity diffusion region 208a, and the second impurity diffusion region 208b is the same as in the method for forming the first embodiment.

The oxidation stopper films are removed by wet etching process using hot phosphoric acid.

A natural oxide film formed on the side surfaces of the first pillar 1a, the channel region pillar 201c and first pillar 201a is removed by wet etching process using dilute hydrofluoric acid (HF), so as to show the clean silicon surface of the semiconductor substrate 1.

As shown in FIG. 13, an insulating film including silicon oxide is deposited to form a fuse insulating film 9 at the each side in which the semiconductor substrate 1 of the first pillar 1a is exposed. While forming the fuse insulating film, the insulating film including silicon oxide is deposited to form the gate insulating film 209 at the each side in which the semiconductor substrate 1 of the channel region pillar 201c and first pillar 201a are exposed.

In a third step, the fuse electrode 10 is formed while the gate electrode 210 of the vertical MOS transistor E is formed. This step will be described referring the FIG. 13.

As shown in FIG. 13, as the same manner of the third step in the first embodiment, the fuse electrode 10 is formed so as to cover the side surface of the base part H of the fuse electrode lead base part H. While the fuse electrode 10 is formed, the gate electrode 210 is formed so as to cover the each side surface of the channel region pillar 201c and the base part G of the gate electrode lead. The material and method of forming the gate electrode 210 are the same as in the fuse electrode 10. That is, it is possible to perform the process of forming the fuse electrode 10 while forming the gate electrode 210.

As shown in FIG. 13, the first interlayer insulating film 11 including silicon oxide is deposited in the first trench 5 and the second trench 6 as shown in FIG. 12 while the first interlayer insulating film 11 is deposited in a first trench 205, a second trench 206 and a third trench 204 as shown in FIG. 12. The method for depositing of the first interlayer insulating film 11 is the same as in the method thereof in the first embodiment.

By doing this, the configuration in which the fuse electrode 10 and the gate electrode 210 are covered by the first interlayer insulating film 11 is obtained.

As shown in FIG. 14, in each region of the antifuse B and the transistor element A, the second interlayer insulating film 12 including silicon oxide is deposited by CVD on the first interlayer insulating film 11 and the nitride masking film 3b.

It may be possible, rather than separating the steps of forming the first interlayer insulating film 11 and the second interlayer insulating film 12, to form them in a single deposition step.

The nitride masking film 3b above the upper surface of the channel region pillar 201c is removed by an etching process, so that the fourth impurity diffusion region 217 is formed on the surface of the semiconductor substrate 1 corresponding to the upper surface of the channel region pillar 201c.

The side wall silicon nitride film 218 is deposited at the side surface of the trench pattern which was made by removing the nitride masking film 3b. In order to fill a gap surrounded by the side wall silicon nitride film 218 and to penetrate a silicon oxide insulating film 3a above the upper part of the fourth impurity diffusion region 217, a third contact plug 219 is formed. The third contact plug 219 is electrically connected to the fourth impurity diffusion region 217

Over the upper part of the third contact plug 219, a fourth contact plug 220 penetrating the second interlayer insulating film 12 and connecting the third contact plug 219 is formed.

Within a region of the fuse insulation protruding region 2a, the second contact plug 14 is formed. The second contact plug 14 penetrates the second interlayer insulating film 12 and the nitride masking film 3b. The second contact plug 14 is electrically connected to the fuse electrode 10 formed on the side surface of the fuse insulation protruding region 2a. Additionally, within a region of the transistor insulating protruding film region 202a, a gate electrode contact plug 214 is formed. The gate electrode contact plug 214 penetrates the second interlayer insulating film 12 and the nitride masking film 3b. The gate electrode contact plug 214 is electrically connected to a gate electrode 210 formed at the side surface of the transistor insulating protruding film region 202a.

The second contact plug 14 may be formed while the gate electrode contact plug 214 is formed.

Also, the second contact plug 14 and the gate electrode contact plug 214 may reach the silicon oxide of the silicon oxide insulating film 3a and the isolation region 2.

The first contact plug 13 is formed. The first contact plug 13 passes through the second interlayer insulating film 12, a first interlayer insulating film 11 and a insulating film 7. The first contact plug 13 is electrically connected to the impurity diffusion region 8. Additionally, a source contact plug 213 is formed so as to penetrate the second interlayer insulating film 12, the first interlayer insulating film 11 and the insulating film 7. The source contact plug 213 is electrically connected to the first impurity diffusion region 208a.

The first contact plug 13 may be formed while the source contact plug 213 is formed.

Titanium (Ti), titanium nitride (TiN), tungsten (W) sequentially deposited in a laminate can be cited as an example of the material of the second contact plug 14, the first contact plug 13, the gate electrode contact plug 214 and the source contact plug 213. The second contact plug 14, the first contact plug 13, the gate electrode contact plug 214, and the source contact plug 213 may be formed in the same processes. When forming the second contact plug 14, the first contact plug 13, the gate electrode contact plug 214, and the source contact plug 213 in the same processes, the difference in etching rates between a silicon nitride film and a silicon oxide film is used in setting the etching conditions so that the second contact plug 14 and the gate electrode contact plug 214 do not penetrate the isolation region 2 and reach the semiconductor substrate 1.

An interconnect 16 connecting with the second contact plug 14 and the gate electrode contact plug 214 and the interconnect 15 connecting with the first contact plug 13 and the source electrode contact plug 213 are formed, using a metal film. An interconnect 221 connecting with the fourth contact plug 220 is formed, using a metal film.

Examples of the material of the metal film may include, but are not limited to, tungsten (W), aluminum (Al), and copper (Cu).

Also, the interconnect 15, the interconnect 16, and the interconnect 221 may be formed in the same processes.

By above-described steps, the semiconductor device according to the present embodiment can be formed as shown in FIG. 11.

As described above, in the semiconductor device 1 according to the present embodiment, the antifuse B and the transistor element A according to the present embodiment can be formed on one semiconductor substrate in the same processes. Also, in the case in which the antifuse B and the transistor element A according to the present embodiment are formed on one semiconductor substrate in the same processes, an additional process for forming an antifuse is not required. Therefore, it is possible to prevent the increase of manufacturing cost.

It is also possible to form the semiconductor device according to the present embodiment as the same manner with the vertical transistor in the related art, which has been described beforehand, with the exception of the configuration of the base part G of the gate electrode lead of the transistor element.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A device comprising:
   a semiconductor body;
   an active semiconductor region projecting from the semiconductor body;
   an isolation region defining the active semiconductor region and being adjacent to the active semiconductor region;
   a mask insulating film formed over the active semiconductor region and the isolation region;
   a projecting portion including a part of the active semiconductor region and a part of the isolation region connected with a first side surface of the part of the active semiconductor region;
   a first electrode covering a side surface of the projecting portion;
   a first insulating film intervening between the first electrode and a second side surface of the part of the active semiconductor region of the projecting portion, the first insulating film being partially breakdown such that the first electrode is electrically connected with the part of the active semiconductor region of the projecting portion;
   a first contact plug formed over and electrically connected with the first electrode;
   an impurity diffusion region being adjacent to a bottom of the part of the active semiconductor region of the projecting portion; and
   a second contact plug formed over and electrically connected with the impurity diffusion region,
   wherein the first contact plug is formed over the part of the isolation region of the projecting portion, and
   wherein the first contact plug is in contact with the part of the isolation region of the projecting portion.

2. The device according to claim 1, wherein a top surface of the first electrode is higher than upper surfaces of the active semiconductor region and the isolation region of the projecting portion and lower than an upper surface of the mask insulating film.

3. The device according to claim 1, wherein the mask insulating film is different in material from the isolation region.

4. The device according to claim 1, wherein the first contact plug is in contact with the mask insulating film.

5. The device according to claim 1, further comprising:
   an additional mask insulating film formed over the active semiconductor region and the isolation region;
   an additional projecting portion formed by using the additional mask insulating film, the additional projecting portion including an additional part of the active semiconductor region and an additional part of the isolation region connected with a first side surface of the additional part of the active semiconductor region;
   a second electrode covering a side surface of the additional projecting portion;
   a second insulating film intervening between the second electrode and a second side surface of the additional part of the active semiconductor region of the additional projecting portion;
   a semiconductor pillar formed adjacently to the additional projecting portion; and
   a third electrode covering a side surface of the semiconductor pillar with an intervention of a third insulating film therebetween, the third electrode formed adjacently and in direct contact with the second electrode and being electrically connected with each other.

6. The device according to claim 5, further comprising:
   a third contact plug formed over and electrically connected with the second electrode;
   a first additional impurity diffusion region being adjacent to a bottom of the additional part of the active semiconductor region of the additional projecting portion and under the second and third electrodes;
   a second additional impurity diffusion region being adjacent to a bottom of the semiconductor pillar;

a fourth contact plug formed over and electrically connected with the second additional impurity diffusion region;
a third additional impurity diffusion region being an upper portion of the semiconductor pillar; and
a fifth contact plug formed over and electrically connected with the third additional impurity diffusion region.

* * * * *